United States Patent
Isojima et al.

(10) Patent No.: US 9,190,838 B2
(45) Date of Patent: Nov. 17, 2015

(54) FAULT CURRENT LIMITER

(75) Inventors: Shigeki Isojima, Osaka (JP); Katsuya Hasegawa, Osaka (JP)

(73) Assignee: SUMITOMO ELECTRIC INDUSTRIES, LTD., Osaka-shi (JP)

( * ) Notice: Subject to any disclaimer, the term of this patent is extended or adjusted under 35 U.S.C. 154(b) by 80 days.

(21) Appl. No.: 14/117,818

(22) PCT Filed: May 9, 2012

(86) PCT No.: PCT/JP2012/061891
§ 371 (c)(1),
(2), (4) Date: Nov. 14, 2013

(87) PCT Pub. No.: WO2012/157494
PCT Pub. Date: Nov. 22, 2012

(65) Prior Publication Data
US 2014/0087950 A1 Mar. 27, 2014

(30) Foreign Application Priority Data
May 18, 2011 (JP) .................. 2011-111328

(51) Int. Cl.
*H02H 9/02* (2006.01)
*H01L 39/16* (2006.01)
*H01F 6/02* (2006.01)

(52) U.S. Cl.
CPC .................. *H02H 9/023* (2013.01); *H01F 6/02* (2013.01); *H01L 39/16* (2013.01); *Y02E 40/69* (2013.01)

(58) Field of Classification Search
CPC ...... H01L 39/22; H01L 39/223; H01L 39/225
See application file for complete search history.

(56) References Cited

U.S. PATENT DOCUMENTS
2010/0254048 A1  10/2010  Darmann

FOREIGN PATENT DOCUMENTS

| CN | 101878572 A |   | 11/2010 |
| JP | 02-159927 A | * | 6/1990 |
| JP | 04-3477 A | * | 1/1992 |
| JP | 05-250932 A |   | 9/1993 |

(Continued)

OTHER PUBLICATIONS

Extended European Search Report for corresponding European Application No. 12785657.3, dated Dec. 3, 2014, 6 pages.
International Search Report for corresponding International Application No. PCT/JP2012/061891, mailed Jun. 26, 2012.

(Continued)

*Primary Examiner* — Colleen Dunn
(74) *Attorney, Agent, or Firm* — Ditthavong & Steiner, P.C.

(57) ABSTRACT

Provided is a fault current limiter that uses a superconductor and can rapidly restore a superconducting state after a current limiting operation. The fault current limiter is configured to perform a current limiting operation through the use of a superconductor and includes a superconducting member (a member including a holding container, a filler and a superconducting wire) including the superconductor, a cooling container, and a suppression member (fins). The cooling container is configured to hold therein the superconducting member and house therein a coolant for cooling the superconducting member. The suppression member (fins) is configured to prevent a boiling state of the coolant from transiting from a nucleate boiling state to a film boiling state in the case where the coolant boils on a surface of the superconducting member (a surface of the holding container) due to a temperature rise of the superconductor during the current limiting operation.

7 Claims, 7 Drawing Sheets

(56) References Cited

FOREIGN PATENT DOCUMENTS

| JP | 07-272959 A | 10/1995 |
| JP | 2001-69665 A | 3/2001 |
| JP | 2006-278135 A | 10/2006 |
| JP | 2009-283678 | * 12/2009 |
| JP | 2009-283678 A | 12/2009 |

OTHER PUBLICATIONS

Shiotsu, M. et al., "Transient Heat Transfer from a Silver Sheated High-Tc Superconducting Tape in Liquid Nitrogen", Proc. of the 16th International Cryogenic Engineering Conference/International Cryogenic Material Conference,vol. 1, 1997, pp. 617-620.

Chinese Office Action for related Chinese Patent Application No. 201280024072.9 dated Jul. 1, 2015, 13 pages.

* cited by examiner

30: SUS PLATE

FAULT CURRENT LIMITER

TECHNICAL FIELD

The present invention relates to a fault current limiter, and in particular, relates to a fault current limiter using a superconductor.

BACKGROUND ART

Conventionally, a fault current limiter using a superconductor is known (for example, see Japanese Patent Laying-Open No. 2006-278135 (PTD 1)). The fault current limiter disclosed in PTD 1 includes a circuit in which a superconducting fault current limiter module having a superconductor and a switch are connected in series, and an external resistor connected in parallel to the circuit. In the fault current limiter, as the superconducting fault current limiter module performs a current limiting operation triggered by an excessive fault current, the current is bypassed to the external resistor, and meanwhile the switch is opened to stop the current supply to the superconducting fault current limiter module.

The fault current limiter described above performs the current limiting operation as the superconductor is quenched by a fault current, however, the temperature of the superconductor rises due to the fault current during the current limiting operation. In the fault current limiter described above, in order to prevent the temperature of the superconductor from rising excessively during the current limiting operation, the switch is opened to stop the fault current from flowing to the superconductor; however, in the case where the switch malfunctions or depending on the conditions under which the fault current has occurred, the temperature of the superconducting may rise rapidly to about 500K, for example.

Affected by the temperature rise of the superconductor, the temperature of a coolant (for example, liquid nitrogen) used to cool the superconductor also rises and reaches a boiling state. When the heat is weak, the boiling state remains at a nucleate boiling state where small bubbles are generated continuously; however, as the heat becomes greater than a critical heat flux for nucleate boiling, the boiling state transits to a film boiling state in which the superconductor is being covered by a film of great bubbles, and the temperature of the superconductor jumps discontinuously to a high temperature. It has been reported that in the film boiling state, the heat flux transferred from the superconductor to the coolant (liquid nitrogen) is only about 15% of the critical heat flux for the nucleate boiling state (for example, see "Transient heat transfer from a silver sheathed high-Tc superconducting tape in liquid nitrogen", Masahiro Shiotsu et. al., Proc. of the 16th International Cryogenic Engineering Conference/International Cryogenic Material Conference, Vol. 1, p. 617-620, 1997 (NPD 1)). The reason therefor is that in the film boiling state, the superconductor is being covered by a film of great bubbles, and thereby the superconductor is thermally insulated from the surrounding coolant.

CITATION LIST

Patent Document

PTD 1: Japanese Patent Laying-Open No. 2006-278135

Non Patent Document

NPD 1: "Transient heat transfer from a silver sheathed high-Tc superconducting tape in liquid nitrogen", Masahiro Shiotsu et. al., Proc. of the 16th International Cryogenic Engineering Conference/International Cryogenic Material Conference, Vol. 1, p. 617-620, 1997

SUMMARY OF INVENTION

Technical Problem

Thus, after the current limiting operation has been performed in a fault current limiter, it is necessary for the fault current limiter to restore a normal state (in other words, to restore a superconducting state from a normal conducting state where the superconductor generates an electrical resistance) as early as possible. However, in a conventional fault current limiter, especially in the case where the temperature of the superconductor rises and the coolant reaches the film boiling state due to the temperature rise of the superconductor, the superconductor is cooled by the coolant at a lower cooling rate than in the nucleate boiling state, and thereby a longer time is needed to restore the superconducting state. In addition, after the boiling state of the coolant reaches the film boiling state, in order to lower the temperature of the coolant so as to return (transit) the coolant from the film boiling state to the nucleate boiling state, it is necessary for the coolant to pass through Leidenfrost point where the heat flux has a minimum value, and thus the heat flux further decreases temporarily (in other words, the cooling rate further decreases). This fact also delays the fault current limiter from restoring the superconducting state.

The present invention has been accomplished in view of the aforementioned problems, and it is therefore an object of the present invention to provide a fault current limiter that uses a superconductor and can rapidly restore a superconducting state after a current limiting operation.

Solution to Problem

The fault current limiter according to the present invention is a fault current limiter configured to perform a current limiting operation through the use of a superconductor. The fault current limiter according to the present invention is provided with a superconducting member including the superconductor, a cooling container, and a suppression member. The cooling container is configured to hold therein the superconducting member and house therein a coolant for cooling the superconducting member. The suppression member is configured to prevent a boiling state of the coolant from transiting from a nucleate boiling state to a film boiling state in the case where the coolant boils on a surface of the superconducting member due to a temperature rise of the superconductor during the current limiting operation.

Accordingly, in the case where the temperature of the superconductor rises during the current limiting operation, it is possible to prevent the boiling state of the coolant used to cool the superconductor from transiting from the nucleate boiling state to the film boiling state. Thus, the heat flux in the coolant for cooling the superconducting member can be prevented from becoming excessively small (as the heat flux in the film boiling state does). Accordingly, in comparison to the case where the coolant has been transited to the film boiling state as mentioned above, it is possible to prevent the temperature of the superconductor from rising during the current limiting operation and also possible to cool rapidly the superconducting member by using the coolant after the current limiting operation. Thereby, it is possible to achieve a fault current limiter capable of restoring the superconducting state faster than the conventional one after the current limiting operation.

Advantageous Effects of Invention

As described in the above, according to the present invention, it is possible to obtain a fault current limiter capable of rapidly restoring the superconducting state after the current limiting operation.

DESCRIPTION OF EMBODIMENTS

Figure 1:
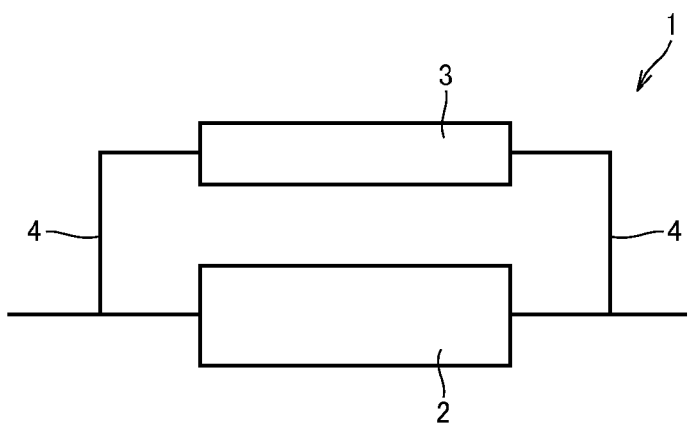
FIG. 1 is a schematic view illustrating a structure of a fault current limiter of the present invention.

Hereinafter, embodiments of the present invention will be described with reference to the drawings. It should be noted that in the drawing mentioned below the same or corresponding portions will be given the same reference numerals and will not be described repeatedly.

A fault current limiter of the present invention will be described with reference to FIGS. 1 to 3.

Figure 6:
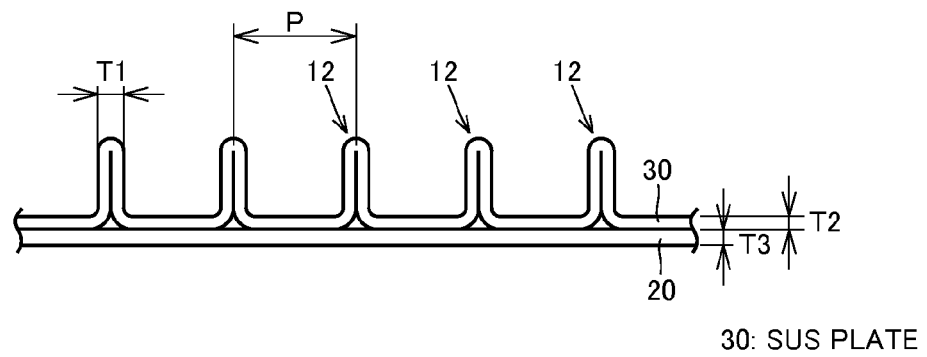
FIG. 6 is a schematic view illustrating an assembly of the superconducting wire and fins which is included in the fault current limiter according to a third modification of an embodiment of the present invention.
Figure 7:
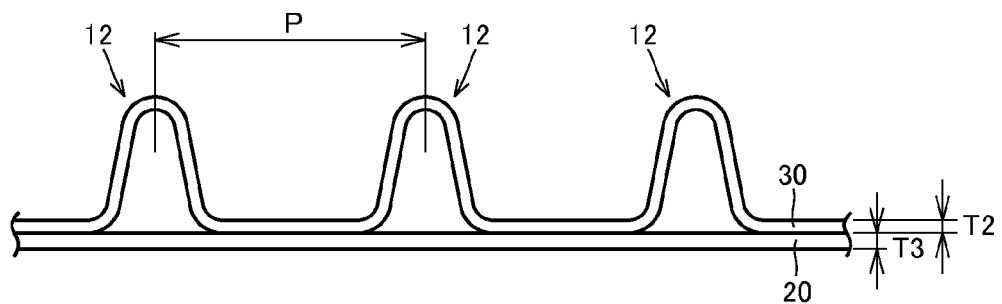
FIG. 7 is a schematic view illustrating an assembly of the superconducting wire and fins which is included in the fault current limiter according to a fourth modification of an embodiment of the present invention.

With reference to FIG. 1, fault current limiter 1 of the present invention has a structure in which a superconducting element 2 and a parallel resistance unit 3 (or a parallel inductance unit) are connected in parallel by conducting wires 4. As illustrated in FIGS. 2 and 3, superconducting element 2 includes a superconducting wire 20 which is disposed inside a cooling container 10. Specifically, a superconducting wire assembly 21 formed by stacking, for example, a plurality of superconducting wires 20 is held inside a holding container 11. Holding container 11 is a pipe having a circular shape in cross section as illustrated in FIG. 3. A filler 17 is disposed inside holding container 11 to fill the space around superconducting wire assembly 21. Furthermore, fins 12, the outer peripheral shape of each is circular in plain view as illustrated in FIGS. 2 and 3, are arranged around the outer periphery of holding container 11. Alternatively, as illustrated in FIG. 6 and FIG. 7 to be described hereinafter, it is acceptable to adopt such a structure in which no holding container is provided for superconducting wire 20 and fins 12 are adhered directly to superconducting wire 20.

As superconducting wire 20, for example, a thin-film superconducting wire having a high electrical resistance value at room temperature can be used; however, it is acceptable to use a bismuth-based silver sheathed superconducting wire if the electrical resistance value thereof required by the fault current limiter can be obtained at room temperature.

As a material for the holding container, for example, a metal such as SUS can be used. In addition, other materials (such as copper alloys, aluminum alloys and silver alloys, for example) capable of obtaining a high specific resistance as a resistor may be used as a material for holding container 11.

Also, fins 12 may be made of the same material as holding container 11; if fins 12 are not continuous longitudinally, it is acceptable that fins 12 are made of other materials having a high thermal conductivity (a metal material such as aluminum or copper, a resin having a good thermal conductivity or the like, for example). Fins 12 are configured as a sheet material spirally fixed on the outer periphery of holding container 11. Further, fins 12 are mounted by extending outward from the outer periphery of holding container 11. In other words, fins 12 are fixed in such a way that they are spirally wrapped around the outer periphery of holding container 11. It is acceptable that members which are formed into an integral spiral shape as a whole as described above are adopted as fins 12, it is also acceptable that a plurality of fins 12, each has a plain shape of a donut, are separately mounted on the outer periphery of holding container 11. It is also acceptable that fins 12 are prepared by bending a wire in the longitudinal direction as illustrated in FIG. 6 and FIG. 7 and then integrated with superconducting wire 20 through adhesion.

As a material for filler 17, for example, a resin such as epoxy resin, a metal such as solder, and the like can be used.

Figure 2:
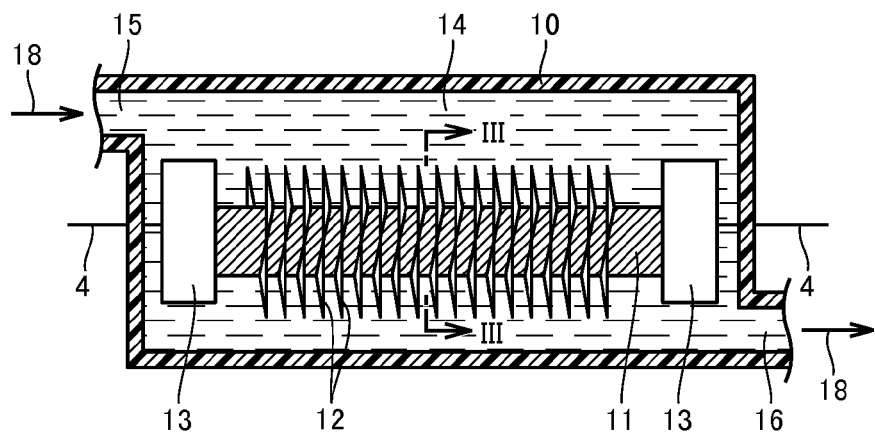
FIG. 2 is a schematic view illustrating a structure of a cooling container which constitutes a superconducting element of the fault current limiter illustrated in FIG. 1 and holds therein a superconducting wire.
Figure 3:
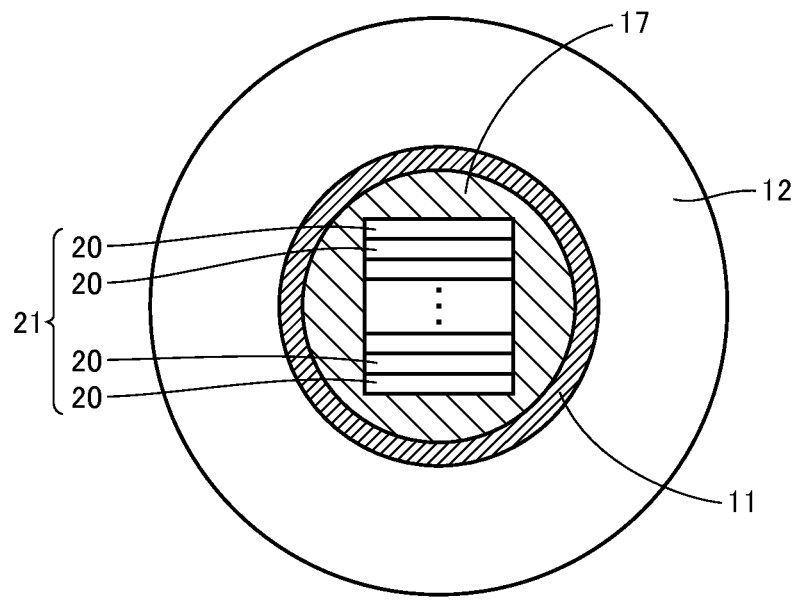
FIG. 3 is a schematic view illustrating a section along a line III-III in FIG. 2.

A pitch of fins 12 (the distance between adjacent fins 12 in the extending direction of holding container 11) illustrated in FIGS. 2 and 3 may be, for example, 3 mm. The height of fins 12 from the surface of holding container 11 may be, for example, 5 mm. The thickness of fins 12 may be, for example, 0.5 mm. The above described pitch, height and the like of fins 12 may be adjusted appropriately so as to prevent a coolant 14 from transiting to film boiling. For example, in the case where the outer diameter of holding container 11 in a cylindrical shape is 11 mm, the pitch of fins 12 may be from 1 mm or more to 50 mm or less, preferably from 2 mm or more to 40 mm or less, and more preferably from 3 mm or more to 30 mm or less. The height of fins 12 may be from 1 mm or more to 50 mm or less, preferably from 2 mm or more to 40 mm or less, and more preferably from 3 mm or more to 30 mm or less.

In the case where a load current is 1200 A, an SUS pipe having an inner diameter of 10 mm and a thickness of 0.5 mm, for example, may be used as holding container 11. As superconducting wire 20, a thin-film superconducting wire having a width of 8 mm may be used. Further, it is possible to stack three superconducting wires 20 to form superconducting wire assembly 21. Furthermore, the entire superconducting wire assembly 21 may be impregnated with resin or solder.

A connection unit 13 for electrically connecting conducting wire 4 and superconducting wire 20 (and holding container 11) is disposed at both ends of holding container 11. Conducting wire 4 and superconducting wire 20 are electrically connected according to any conventionally well-known method inside connection unit 13.

Cooling container 10 is disposed with an introducing unit 15 for supplying coolant 14 which flows in cooling container 10 and a discharging unit 16 for discharging supplied coolant 14 to the outside. As illustrated by an arrow 18, coolant 14 introduced into cooling container 10 from introducing unit 15 absorbs heat generated from superconducting wire 20 through the intermediary of filler 17 and holding container 11. As a result, it is possible to keep superconducting wire 20 at a sufficiently low temperature where superconducting wire 20 is superconductive.

As illustrated by arrow 18, coolant 14 discharged to the outside through discharging unit 16 is cooled down by a heat exchanger (not shown) or the like and is supplied back to introducing unit 15 by a pump or the like (not shown). Thus, coolant 14 is held in a closed system including cooling container 10, and in the closed system coolant 14 is kept circulating. It is acceptable that the closed system is disposed with a coolant storing tank or the like so as to keep coolant 14 at an amount and a pressure in the closed system. It is acceptable to dispose a temperature sensing member (for example, a temperature sensor or the like) in the vicinity of both introducing unit 15 and discharging unit 16 or at least in the vicinity of discharging unit 16 for measuring the temperature of coolant 14. Thereby, the temperature of coolant 14 is measured by the temperature sensing member, and the heat exchanger may be controlled in accordance with the measurement result to appropriately adjust the cooling state of coolant 14. Such control may be performed by a control unit (not shown) which is connected to the heat exchanger, the pump and the like and is configured to send control signals thereto. Alternatively, it is acceptable that coolant 14 is housed in cooling container 10 without being circulated, and a heat exchange head of the heat exchanger is inserted into cooling container 10 from the outside for cooling coolant 14 through heat exchange.

As mentioned above, since a projection member serving as a suppression member, such as fins 12, is formed on the contact interface (outer peripheral surface of holding container 11 in the structure illustrated in FIG. 2) between coolant 14 and the superconducting member which includes superconducting wire 20, filler 17 and holding container 11, it is possible to prevent coolant 14 from transiting to the film boiling state on the surface of holding container 11 during the current limiting operation. The details will be described hereinafter.

Fault current limiter 1 illustrated in FIG. 1 according to the present invention performs a current limiting operation in response to an inflow of an excessive fault current equal to or greater than a predetermined value. In other words, as an excessive fault current flows in, the superconducting state of superconducting wire 20 collapses (quenches), and superconducting wire 20 falls into a state of having an electrical resistance value. At this time, the current flows through both superconducting wire 20 in the state of having an electrical resistance value and parallel resistor unit 3 or the parallel inductance unit. As the current flows through superconducting wire 20 which has become electrically resistant, the temperature of superconducting wire 20 rises rapidly. Affected by the temperature rise, the temperature of the surface of holding container 11 and the temperature of coolant 14 in the vicinity of the surface also rise rapidly, and consequently coolant 14 vaporizes (boils).

At this time, in the case where no projection or the like is formed particularly on the surface of holding container 11, the boiling state of coolant 14 is easy to transit from the nucleate boiling state to the film boiling state. If fallen into the film boiling state, a longer time will be required to cool down superconducting wire 20 quenched from the superconducting state back to a temperature where superconducting wire 20 becomes superconductive. The reason is that since the heat flux between coolant 14 in the film boiling state and the surface of holding container 11 is small, it is difficult for coolant 14 to sufficiently cool down holding container 11 (i.e., superconducting wire 20). Moreover, as described in the above, in order to return to the nucleate boiling state from the film boiling state, it is necessary for the coolant to pass through the so-called Leidenfrost point where the heat flux has a minimum value, and this fact also explains why a longer time will be required to cool down superconducting wire 20.

However, by disposing a projection member (fins 12) projecting from the surface (side surface) of holding container 11 which forms the contact interface between coolant 14 and holding container 11 as conducted in the present invention, it is possible to prevent the nucleate boiling state of coolant 14 from transiting to the film boiling state. As a result, even in the case where fault current limiter 1 is performing the current limiting operation (in other words, in the case where superconducting wire 20 is quenched), it is possible to prevent the boiling state of coolant 14 from transiting from the nucleate boiling state to the film boiling state which is caused by the rapid rise of the temperature of superconducting wire 20. That is, coolant 14 can be kept in a nucleate boiling-film boiling mixing state even after the superconducting wire is quenched, and thereby, the heat flux flowing from holding container 11 to coolant 14 is greater than the case where coolant 14 is in the film boiling state. Therefore, it is possible for coolant 14 to absorb the heat of superconducting wire 20 more quickly than the case where coolant 14 is in the film boiling state. Thus, it is possible to quickly cool superconducting wire 20 down to a temperature range where it is superconductive after the current limiting operation. Accordingly, it is possible to obtain fault current limiter 1 capable of restoring the superconducting state quickly than a conventional one after the current limiting operation.

Figure 4:
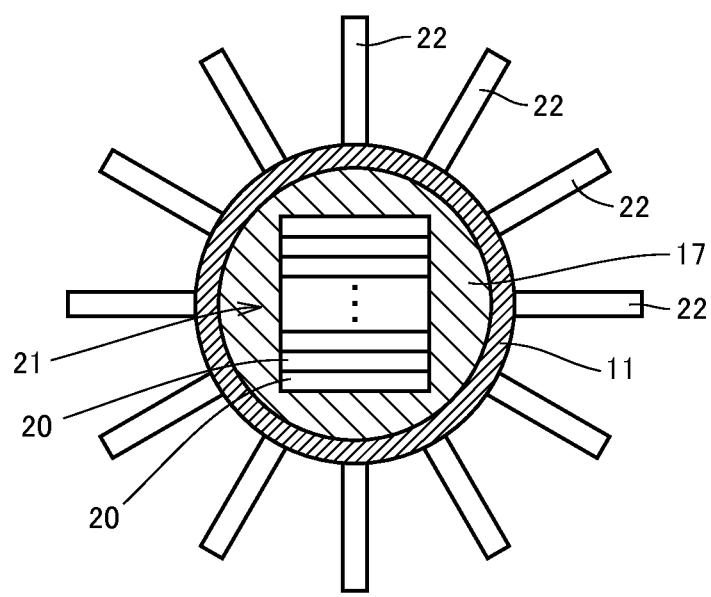
FIG. 4 is a schematic view illustrating a section of a holding container for the superconducting wire, which is included in the fault current limiter according to a first modification of an embodiment of the present invention.

With reference to FIG. 4, the fault current limiter according to a first modification of the embodiment of the present invention will be described. In addition, FIG. 4 corresponds to FIG. 3.

Fault current limiter 1 equipped with holding container 11 illustrated in FIG. 4 has basically the same structure as fault current limiter 1 illustrated in each of FIGS. 1 to 3 except that holding container 11 has a different structure. Specifically, in place of the plate-shaped or donut-shaped fins 12 (see FIG. 3), a plurality of column-shaped (rod-shaped) projections 22 are arranged on the surface of holding container 11. Column-shaped projections 22 are configured to extend outward from the outer peripheral surface of holding container 11. In other words, column-shaped projections 22 are disposed by radially extending outward from the center in the cross section of holding container 11. Moreover, a plurality of column-shaped projections 22 are disposed by aligning on the outer peripheral surface (side surface) of holding container 11 in the extending direction of holding container 11. Note that the cross section of each column-shaped (rod-shaped) projection 22 in the direction orthogonal to the extending direction may be of any shape, for example, a polygonal shape such as a rectangular or triangular shape, a circular shape or the like.

In the case where superconducting wire 20 is quenched in the current limiting operation, it is possible for columnar projections 22 having the abovementioned structure to prevent coolant 14 from transiting to the film boiling state from the nucleate boiling state on the surface of holding container 11. As a result, it is possible to obtain the same effects as fault current limiter 1 illustrated in each of FIGS. 1 to 3.

Figure 5:
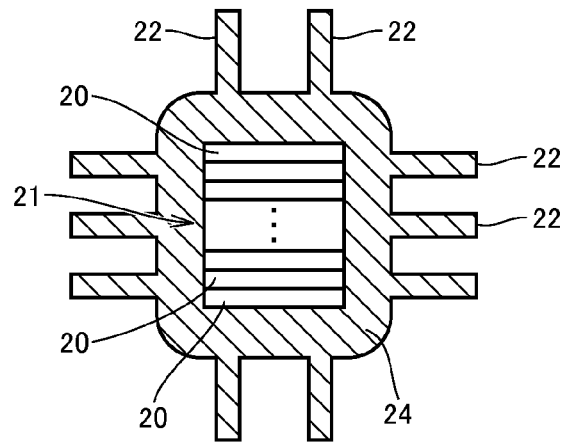
FIG. 5 is a schematic view illustrating a section of a superconducting wire assembly which is included in the fault current limiter according to a second modification of an embodiment of the present invention.

With reference to FIG. 5, the fault current limiter according to a second modification of the embodiment of the present invention will be described. In addition, FIG. 5 corresponds to FIG. 3.

With reference to FIG. 5, the fault current limiter according to the second modification of the present invention has basically the same structure as fault current limiter 1 illustrated in each of FIGS. 1 to 3 except that the structure in the vicinity of superconducting wire assembly 21 is different. In other words, in fault current limiter 1 illustrated in each of FIGS. 1 to 3, superconducting wire assembly 21 is housed in holding container 11 together with filler 17. However, superconducting wire assembly 21 illustrated in FIG. 5 is surrounded by covering material 24, without being held in an independent holding container in particular. A plurality of column-shaped (rod-shaped) projections 22 are directly disposed on the surface of coating material 24 surrounding the superconducting wire assembly 21 illustrated in FIG. 5. In other words, in the fault current limiter equipped with superconducting wire assembly 21 illustrated in FIG. 5, the outer peripheral surface of coating member 24 is in direct contact with coolant 14 (see FIG. 2). In the abovementioned structure, since column-shaped projections 22 are disposed on the contact interface to coolant 14, in the case where superconducting wire 20 is quenched due to the flowing of a fault current in the fault current limiter, it is possible to prevent coolant 14 from transiting to the film boiling state from the nucleate boiling state on the surface of coating member 24 serving as the contact interface to coolant 14. As a result, it is possible to obtain the same effects as fault current limiter 1 illustrated in each of FIGS. 1 to 3.

In the present invention, a resistance-typed fault current limiter has been described as an example of fault current limiter 1; however, the present invention is applicable to a superconducting fault current limiter in other type (such as a magnetic shielding fault current limiter), and is applicable to any fault current limiter if it is such a fault current limiter that employs superconducting SN transition.

With reference to FIG. 6, the fault current limiter according to a third modification of the embodiment of the present invention will be described. With reference to FIG. 6, the fault current limiter according to the third modification of the present invention has basically the same structure as fault current limiter 1 illustrated in each of FIGS. 1 to 3 except that the structure in the vicinity of superconducting wire assembly 21 is different. In other words, in fault current limiter 1 illustrated in each of FIGS. 1 to 3, superconducting wire assembly 21 is housed in holding container 11 together with filler 17. However, in the fault current limiter according to the third modification of the present invention, fins 12 are directly connected to the surface of superconducting wire 20. Specifically, fins 12 are formed by bending a belt-shaped member 30 made of a material, such as metal, which is superior in thermal conductivity, and belt-shaped member 30 from which fins 12 is formed are directly attached to the surface of superconducting wire 20. Superconducting wire 20 attached with fins 12 is disposed inside a cooling device 10, for example illustrated in FIG. 2, and is connected to conducting wire 4. It is preferable that a plurality of fins 12 are formed in belt-like member 30. Any material may be used as the material of belt-shaped member 30, however, it is preferable to use a material having a relatively high electrical resistance and a high thermal conductivity. For example, stainless steel, copper alloy, aluminum alloy, silver alloy or the like may be used as the material of belt-like member 30. Any approach, for example solder welding approach may be used to attach fins 12 (belt-shaped member 30) to superconducting wire 20. Since fins 12 are attached directly to superconducting wire 20, it is possible to further simplify the structure of the fault current limiter illustrated in each of FIGS. 1 to 3.

The width T1 of fin 12 illustrated in FIG. 6, the pitch P between adjacent fins 12 and the thickness T2 of belt-shaped member 30 may be, for example, 0.6 mm, 3.0 mm and 0.3 mm, respectively. The height of fins 12 may be, for example, 2 mm.

With reference to FIG. 7, the fault current limiter according to a fourth modification of the embodiment of the present invention will be described. With reference to FIG. 7, the fault current limiter according to the fourth modification of the present invention has basically the same structure as fault current limiter 1 employed with superconducting wire 20 attached with fins 12 as illustrated in FIG. 6 except that the structure of fins 12 is different from that in superconducting wire 20 illustrated in FIG. 6. In other words, in superconducting wire 20 as illustrated in FIG. 7, fins 12 are formed by bending belt-shaped member 30 to have inclined side surfaces (the cross-section of each fin has an inverted V shape), and belt-like member 30 formed with such fins 12 is attached to superconducting wire 20. It is possible for the fault current limiter with such structure to obtain the same effects as the fault current limiter using the superconducting wire illustrated in FIG. 6.

The pitch P between adjacent fins 12 illustrated in FIG. 7 may be, for example, 6 mm.

Additionally, in place of fins 12 illustrated above in FIGS. 6 and 7, the projection member of another shape may be joined directly to superconducting wire 20. For example, a heat radiation member formed with a column-shaped projection may be directly joined to superconducting wire 20. The column-shaped projection may be formed in plural number.

Experiment 1

In order to confirm the effects of the present invention, the following experiment was conducted.

Sample

Example

A sample having the structure of holding container 11 illustrated in FIGS. 2 and 3 was prepared as the holding container. More specifically, a pipe made of SUS was prepared as the holding container. The inner diameter of the pipe is 4 mm, the thickness thereof is 0.5 mm, and the length thereof is 2000 mm. 10 thin-film superconducting wires, each is 2 mm in width, were housed inside the pipe. Each of the thin-film superconducting wires was constructed to include an Ag protective layer having a thickness of 8 μm and a SUS substrate having a thickness of 100 μm. The inner side of the pipe was filled with resin.

Fins having a thickness of 1 mm and a height of 3 mm were helically arranged on the outer periphery of the pipe with a pitch of 3 mm.

Comparative Example

The sample of Comparative Example was prepared to have basically the same structure as the sample of the above Example except that there were no fins installed on the outer periphery of the pipe.

Experiment

After each of the sample of Example and the sample of Comparative Example described above was connected to an AC power source and cooled in liquid nitrogen, a current test was conducted thereon under an electrifying condition at 1 kA for 5 cycles without performing the current limiting operation. The temperature change on the surface of the pipe was measured in the current test.

Results

For the sample of Example, after the current limiting operation was triggered by the current in the current test, the surface temperature of the pipe increased to about 21K, and at the end of electrification, the temperature of the pipe dropped immediately and the superconducting wire restored the superconducting state.

On the other hand, for the sample of Comparative Example, after the current limiting operation was triggered by the current in the current test, the surface temperature of the pipe increased to 167K; and it took 10 seconds to restore the superconducting state. Moreover, at the end of the current limiting operation, liquid nitrogen on the surface of the pipe felt into the film boiling state.

Thus, it was confirmed that the superconducting fault current limiter according to the present invention can restore the superconducting state immediately after the current limiting operation.

Experiment 2

In order to verify the principles of the present invention, the following experiment was conducted.

Sample

Three kinds of samples (test heaters No. 1 to 3) were prepared.

Test Heater No. 1:
Test heater No. 1 was prepared to have a length of 100 mm from a stainless steel pipe having an outer diameter of 5.8 mm and a thickness of 0.5 mm. No fin is formed on test heater No. 1.

Test Heater No. 2:
Test heater No. 2 was the same as test heater No. 1 except that fins were formed on the surface of the stainless steel pipe. Each fin had a circular shape in plain view, and the distance from the surface of the pipe to the outer peripheral edge of the fin (height of the fin) was 2.6 mm. The material of the fin was stainless steel, and the thickness thereof was 0.2 mm. 19 pieces of fins were disposed with a spacing of 5 mm in the extending direction of the pipe.

Test Heater No. 3:
Test heater No. 3 had basically the same structure as test heater No. 2 except that the spacing between the fins was 2 mm and the number of fins was 45.

Experiment

Experiment 1

In order to obtain a boiling curve showing a relationship between a heat flux and a temperature rise of a cooling surface, test heaters No. 1 to 3 were subject to the following experiment. Specifically, the heaters were heated through conducting an electric current, and an input energy of which was controlled to increase exponentially with time. The coolant is liquid nitrogen at atmospheric pressure. The test heaters were set in a low temperature container and energized, and the electrical resistance of the heaters at each time was measured. The temperatures of the heaters were determined according to a heater's temperature-electrical resistance curve prepared previously. Heat radiation amount (heat flux×the area of cooling surface) and superheat illustrated in the graphs of FIGS. 8 to 10 which will be described later were obtained from the experiment. Note that the heat radiation amount is a value obtained by subtracting the heat capacity increase from the input energy, and the superheat ($\Delta T_L$) is a difference between the temperature of the heater and the temperature of the coolant (temperature of the cooling surface).

Experiment 2

After the input heat was increased exponentially to make test heaters No. 1 to 3 reach the critical heat flux point, a test (recovery test) in which the input heat was decreased exponentially was conducted on test heaters No. 1 to 3, using the experiment apparatus described above. From the experiment, data for a boiling curve were obtained by calculating the temperature changes of the surface of the test heaters and the heat flux. More specifically, in the device having the same configurations as that in Experiment 1, the time constant τ for the heat rate rise at saturated conditions under atmospheric pressure was set to 2 seconds. Moreover, the time required by the superheat to drop from 100K to 10K as the temperature of the test heaters started to decrease was measured in Experiment 2.

Results

Results of Experiment 1

Figure 8:
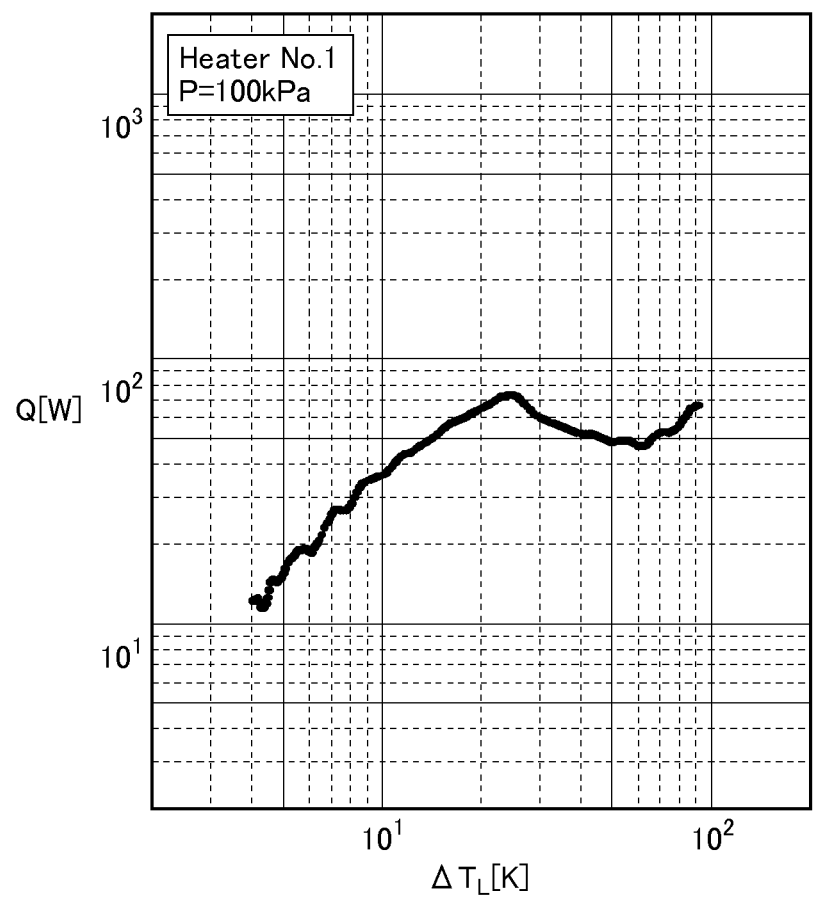
FIG. 8 is a graph of an experimental result.
Figure 9:
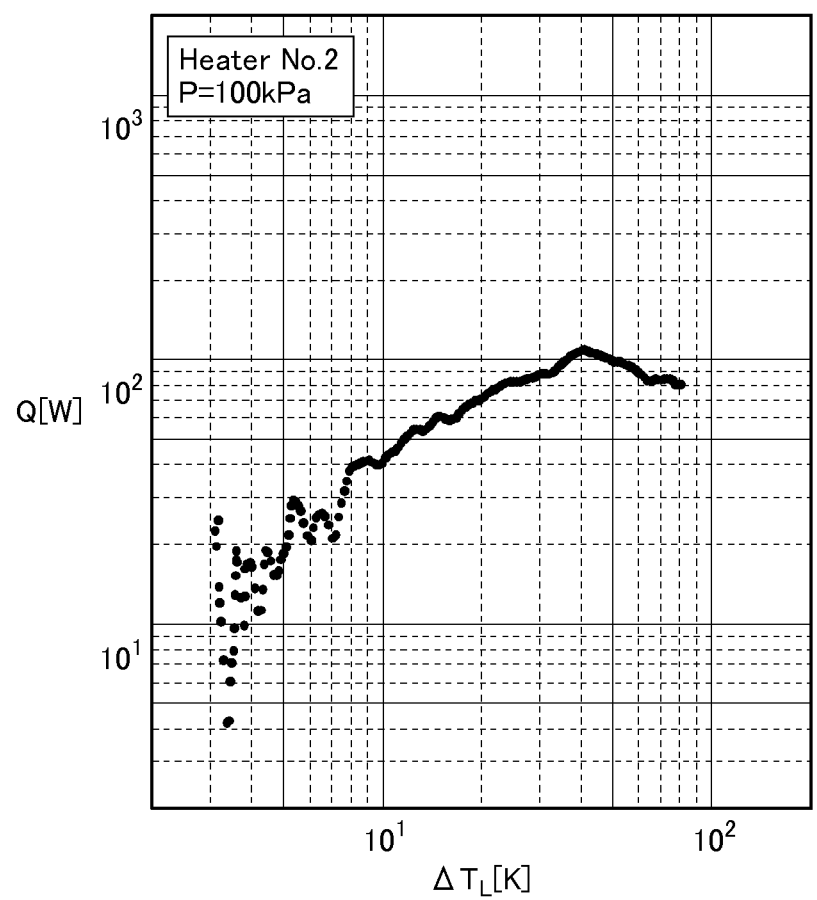
FIG. 9 is a graph of an experimental result.
Figure 10:
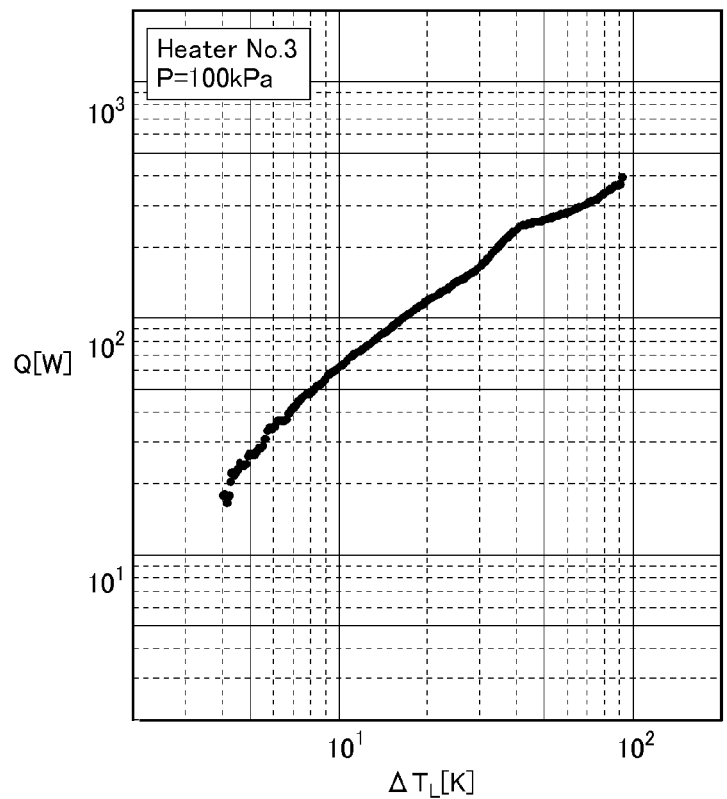
FIG. 10 is a graph of an experimental result.

The results are shown in FIGS. 8 to 10. FIGS. 8 to 10 show the results of test heaters No. 1 to 3, respectively. With reference to FIGS. 8 to 10, the vertical axis represents a heat flux corresponding to a heat radiation amount (unit: W, more precisely the heat flux×the area of cooling surface), and the horizontal axis represents a superheat (unit: K) which is a difference between the surface temperature of a test heater and the temperature of coolant surrounding the test heater.

With reference to FIGS. 8 to 10, in test heaters No. 1 and 2, the temperature increases to exceed the critical heat flux point, and thereafter the heat radiation amount decreases due to the transition to the film boiling state from the nucleate boiling state. Meanwhile, in test heater No. 3, the heat radiation amount does not decrease but keeps increasing even after the temperature increases to exceed the critical heat flux point. It is considered that the reason should be that the surface shape of test heater No. 3 has been made complex with a sufficient number of fins formed thereon, making it difficult to form the vapor film and thereby preventing the boiling state from transiting to a complete film boiling state. In addition, it is also found that the more the fins are formed, the greater the value of the critical heat flux point (maximum value of the heat flux) will be and so will the overheat. In other words, the suppression member configured to prevent the boiling state from transiting from the nucleate boiling state to the film boiling state can increase the critical heat flux point and the overheat in the nucleate boiling state, and thereby, more heat radiation amount can be absorbed during the nucleate boiling state. Therefore, the operations of the fault current limiter can be implemented in the nucleate boiling state, making the fault current limiter capable of restoring the superconducting state at an extremely rapid speed.

Results of Experiment 2

Figure 11:
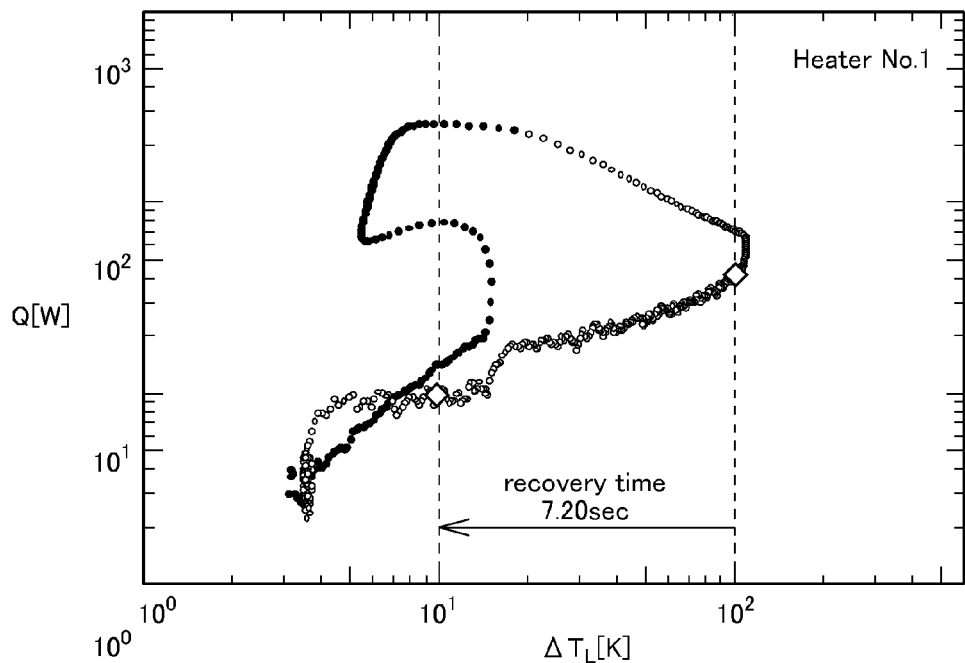
FIG. 11 is a graph of an experimental result.
Figure 12:
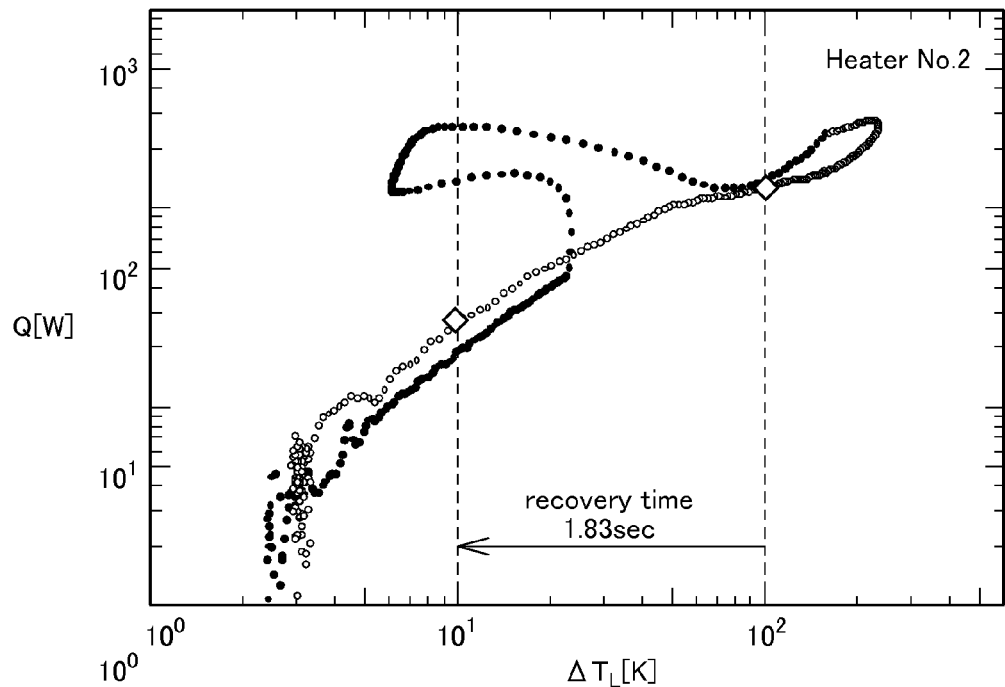
FIG. 12 is a graph of an experimental result.
Figure 13:
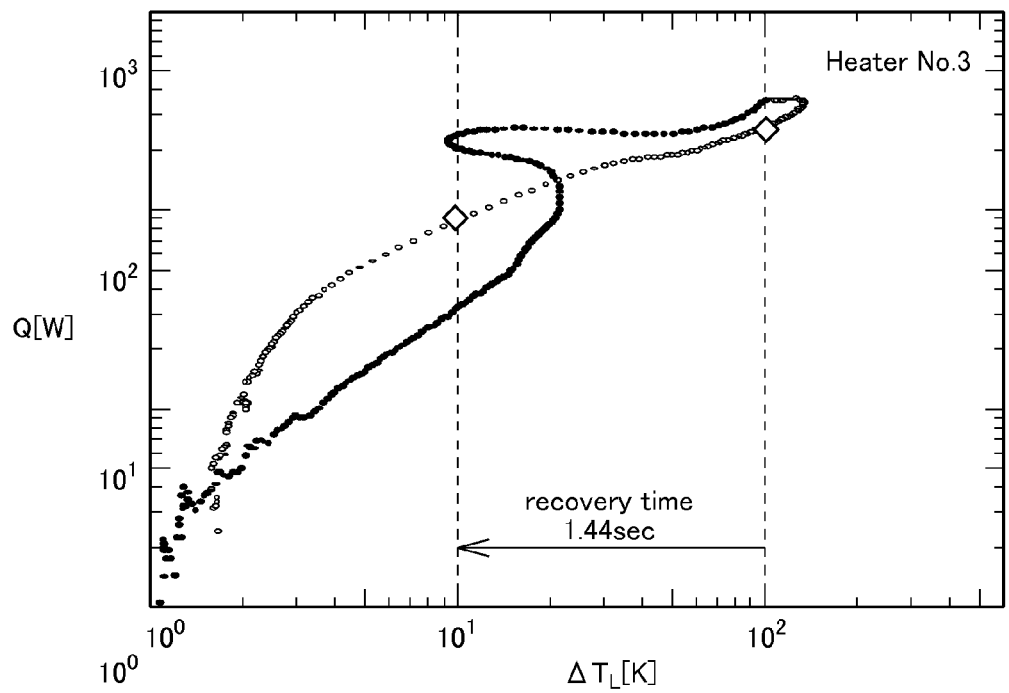
FIG. 13 is a graph of an experimental result.

The results are shown in FIGS. 11 to 13. FIGS. 11 to 13 show the results of test heaters No. 1 to 3, respectively. With reference to FIGS. 11 to 13, the vertical axis and the horizontal axis in each graph are the same as those in the graphs illustrated in FIGS. 8 to 10. In addition, in FIGS. 11 to 13, the curve in black circles represents data of increasing heat radiation amount, and the curve in white circles represents data of decreasing heat radiation amount.

The vertical axis represents a heat flux corresponding to a heat radiation amount (unit: W, more precisely the heat flux× the area of cooling surface), and the horizontal axis represents a superheat (unit: K) which is a difference between the surface temperature of a test heater and the temperature of coolant surrounding the test heater. With reference to FIGS. 11 to 13, it is obvious that in test heater No. 1, as illustrated in FIG. 11, the boiling state transits to the film boiling state from the nucleate boiling state at a superheat of about 10K and jumps to the film boiling state having a small heat radiation amount at a superheat of about 100K. On the other hand, in test heaters No. 2 and 3 illustrated in FIGS. 12 and 13, even though the transition occurs, the boiling state does not transit from the nucleate boiling state to the complete film boiling state but to the nucleate boiling-film boiling mixing state having a great heat radiation amount, and thereafter the temperature decreases relatively rapidly.

As illustrated in FIGS. 11 to 13, the time for the superheat to drop from 100K to 10K in test heater No. 1 was 7.2 seconds, however, the time was 1.83 seconds in test heater No. 2 and the time was 1.44 seconds in test heater No. 3. Thus, the time required to cool down test heaters No. 2 and 3 is shorter than the time required to cool down test heater No. 1.

Hereinafter, the characteristic components of the present invention will be described, some of which may duplicate those described in the above embodiments.

Fault current limiter 1 configured to perform a current limiting operation through the use of a superconductor according to the present invention includes a superconducting member (the member including holding container 11, filler 17 and superconducting wires 20 as illustrated in FIG. 3, or the member including covering material 24 and superconducting wires 20 as illustrated in FIG. 5, or the member including fins 12 and superconducting wire 20 with fins 12 installed on the surface thereof as illustrated in FIG. 6 or FIG. 7) containing the superconductor (superconducting wires 20), cooling container 10, and a suppression member (fins 12 as illustrated in FIGS. 2, 6 and 7 or column-shaped projections 22 as illustrated in FIGS. 4 and 5). Cooling container 10 is configured to hold therein the superconducting member (the member including holding container 11, filler 17 and superconducting wires 20 as illustrated in FIG. 3, or the member including covering material 24 and superconducting wires 20 as illustrated in FIG. 5, or the member including fins 12 and superconducting wire 20 with fins 12 installed on the surface thereof as illustrated in FIG. 6 or FIG. 7) and house therein coolant 14 for cooling the superconducting member. Suppression member (fins 12 as illustrated in FIGS. 2, 6 and 7 or column-shaped projections 22 as illustrated in FIGS. 4 and 5) is configured to prevent the boiling state of coolant 14 from transiting from the nucleate boiling state to the film boiling state in the case where coolant 14 boils on the surface of the superconducting member (the surface of holding container 11, the surface of covering material 24 or the surface of superconducting wire 20 in FIGS. 6 and 7) due to a temperature rise of the superconductor (superconducting wire 20) during a current limiting operation.

Accordingly, in the case where the temperature of superconducting wire 20 rises during the current limiting operation, it is possible to prevent the boiling state of coolant 14 for cooling superconducting wire 20 from transiting from the nucleate boiling state to the film boiling state. Thus, the heat flux for transferring heat from the superconducting member (the member including holding container 11, filler 17 and superconducting wires 20 as illustrated in FIG. 3, or the member including covering material 24 and superconducting wires 20 as illustrated in FIG. 5, or the member including fins 12 and superconducting wire 20 with fins 12 installed on the surface thereof as illustrated in FIG. 6 or FIG. 7) to coolant 14 can be prevented from becoming excessively small (as the heat flux in the film boiling state does). Therefore, in comparison to the case where coolant 14 has been transited to the film boiling state as mentioned above, it is possible to prevent the temperature of superconducting wire 20 from rising during the current limiting operation and also possible to cool rapidly superconducting wire 20 by using coolant 14 after the current limiting operation. Thereby, it is possible to achieve fault current limiter 1 capable of restoring the superconducting state faster than the conventional one after the current limiting operation. In addition, providing the suppression member saves the necessity of disposing an element such as a switch or the like for breaking a current to the superconductor in the current limiting operation, which makes it possible to simplify the structure of fault current limiter 1 and to improve the reliability thereof as well.

In fault current limiter 1 described above, it is acceptable that the suppression member includes a projection member (fins 12 or column-shaped projections 22 as illustrated in FIG. 4 or the like) formed on the surface of the superconducting member (the surface of holding container 11, the surface of covering material 24 or the surface of superconducting wire 20 in FIGS. 6 and 7). In the present invention, the boiling state of coolant 14 on the surface of the superconducting member can be prevented from transiting from the nucleate boiling state to the film boiling state if the projections (fins 12 or column-shaped projections 22) are formed on the surface of holding container 11 or covering material 24 or superconducting wires 20 which constitutes the contact interface between coolant 14 and holding container 11 or covering material 24 or superconducting wires 20. It is considered that the reason should be that the presence of fins 12 or column-shaped projections 22 disturbs the uniform temperature distribution on the surface of the superconducting member (the surface of holding container 11, the surface of covering material 24 or the surface of superconducting wire 20 in FIGS. 6 and 7), which makes it difficult for evaporated coolant 14 to continue to cover the surface of the superconducting member (gas layer of evaporated coolant 14 covering the surface of holding container 11, the surface of covering material 24 or the surface of superconducting wire 20). Thereby, the transition of coolant 14 to the film boiling state can be prevented with certainty by fins 12 or column-shaped projections 22.

In fault current limiter 1 described above, it is acceptable that the projection member is a plate-shaped member (fins 12) formed on the surface of the superconducting member (the surface of holding container 11, the surface of covering material 24 or the surface of superconducting wire 20 in FIGS. 6 and 7) and projecting outward from the surface of the superconducting member. In this case, since the shape of the projection member, that is, the shape of fin 12 is relatively simple, it is easy to form the projection member. Thereby, it is possible to simplify the manufacturing procedure of fault current limiter 1 in comparison to the case where the projection member is formed into a complicated shape, and as a result, prevent the manufacturing cost of fault current limiter 1 from rising.

In fault current limiter 1 described above, it is acceptable that the projection member is a column-shaped member (column-shaped projections 22) formed on the surface of the superconducting member (the surface of holding container 11, the surface of covering material 24 or the surface of superconducting wire 20 in FIGS. 6 and 7) and projecting outward from the surface of the superconducting member. In this case, since the shape of the projection member, that is, the shape of column-shaped projections 22 is relatively simple, it is easy to form the projection member. Thereby, it is possible to simplify the manufacturing procedure of fault current limiter 1 in comparison to the case where the projection member is formed into a complicated shape, and as a result, prevent the manufacturing cost of fault current limiter 1 from rising.

In fault current limiter 1 described above, as illustrated in FIGS. 2 to 4, it is acceptable that the superconducting member includes superconducting wire 20 having the superconductor, a container (holding container 11) configured to hold therein superconducting wire 20, and filler 17 filling a space inside container 11 between superconducting wire 20 and an inner wall of holding container 11. In this case, the suppression member such as the projection member or the like is not formed directly on the superconducting wire 20 but on the surface of holding container 11 which constitutes the superconducting member. Thereby, it is possible to prevent superconducting wire 20 from being damaged when a projection member or the like is formed directly on the surface of superconducting wire 20.

In fault current limiter 1 described above, as illustrated in FIG. 5, it is acceptable that the superconducting member includes superconducting wire 20 having the superconductor, and covering material 24 covering the outer periphery of superconducting member 20. In this case, the suppression member such as the projection member or the like is not formed directly on superconducting wire 20 but on the surface of covering member 24 which constitutes the superconducting member. Thereby, it is possible to prevent superconducting wire 20 from being damaged when forming a projection member or the like directly on the surface of superconducting wire 20.

In fault current limiter 1 described above, it is acceptable that the projection member (column-shaped projections 22 or fins formed on the surface of covering material 24 as the plate-shaped member) is formed integrally to covering material 24. In this case, since covering material 24 and the projection member are formed integrally, it is possible to reduce the number of components to be prepared to produce fault current limiter 1 relative to the case where the projection member is prepared as a separate member. Moreover, since covering material 24 and the projection member are integral, in comparison to the case where covering material 24 is jointed to the projection member which is a separate member relative to covering material 24, it is possible to improve heat transfer in the boundary between covering material 24 and the projection member.

In fault current limiter 1 described above, as illustrated in FIGS. 6 and 7, it is acceptable that the superconducting member is superconducting wire 20 including the superconductor. In this case, it is possible to simplify the structure of fault current limiter 1. Moreover, since the projection member such as fins 12 or the like is formed directly on superconducting wire 20, the cooling by the superconducting wire becomes efficient, and as a result, it is possible to improve the performance of the fault current limiter.

Fault current limiter 1 configured to perform a current limiting operation through the use of a superconductor according to the present invention includes superconducting wire 20 containing the superconductor, cooling container 10, and suppression member (fins 12 in FIGS. 6 and 7). Cooling container 10 is configured to house therein coolant 14 for cooling superconducting wire 20. Suppression member (projection member such as fins 12 in FIGS. 6 and 7 or any shape such as a column shape) is configured to prevent the boiling state of coolant 14 from transiting from the nucleate boiling state to the film boiling state in the case where coolant 14 boils on a surface of superconducting wire 20 due to a temperature rise of the superconductor during a current limiting operation.

Accordingly, in the case where the temperature of superconducting wire 20 rises during the current limiting operation, it is possible to prevent the boiling state of coolant 14 for cooling superconducting wire 20 from transiting from the nucleate boiling state to the film boiling state. Thus, the heat flux for transferring heat from the superconducting wire 20 to coolant 14 can be prevented from becoming excessively small (as the heat flux in the film boiling state does). Therefore, in comparison to the case where coolant 14 has transited to the film boiling state as mentioned above, it is possible to prevent the temperature of superconducting wire 20 from rising during the current limiting operation and also possible to cool rapidly superconducting wire 20 by using coolant 14 after the current limiting operation. Thereby, it is possible to achieve fault current limiter 1 capable of restoring the superconducting state faster than the conventional one after the current limiting operation. In addition, providing the suppression member saves the necessity of disposing an element such as a switch or the like for breaking a current to the superconducting wire 20 in the current limiting operation, which makes it possible to simplify the structure of fault current limiter 1 and to improve the reliability thereof as well.

In fault current limiter 1 described above, it is acceptable that the suppression member includes a projection member (fins 12) formed on the surface of the superconducting wire 20. In this case, the uniform temperature distribution on the surface of superconducting wire 20 will be disturbed, which makes it possible to prevent the transition of coolant 14 on the surface of superconducting wire 20 to the film boiling state with certainty. In addition, the projection member may be, for example, a plate-shape member or a column-shaped member extending outward from the surface of superconducting wire 20. In this case, it is easy to form the projection member.

It should be understood that the embodiments disclosed herein have been presented for the purpose of illustration and description but not limited in all aspects. It is intended that the scope of the present invention is not limited to the description above but defined by the scope of the claims and encompasses all modifications equivalent in meaning and scope to the claims.

INDUSTRIAL APPLICABILITY

The present invention is advantageously applicable to a fault current limiter using a superconductor in particular.

REFERENCE SIGNS LIST

1: fault current limiter; 2: superconducting element; 3: parallel resistance unit; 4: conducting wire; 10: cooling container; 11: holding container; 12: fin; 13: connection unit; 14: coolant; 15: introducing unit; 16: discharging unit; 17: filler; 18: arrow; 20: superconducting wire; 21: superconducting wire assembly; 22: column-shaped projection; 24: covering material or belt-shaped member

The invention claimed is:

1. A fault current limiter configured to perform a current limiting operation through the use of a superconductor, comprising:

a superconducting member including said superconductor;

a cooling container configured to hold therein said superconducting member and house therein a coolant for cooling said superconducting member; and a suppression member configured to prevent a boiling state of said coolant from transiting from a nucleate boiling state to a film boiling state in the case where said coolant boils on a surface of said superconducting member due to a temperature rise of said superconductor during the current limiting operation, wherein said suppression member includes a projection member formed on the surface of said superconducting member.

2. The fault current limiter according to claim 1, wherein said projection member is a plate-shaped member formed on the surface of said superconducting member and projecting outward from the surface of said superconducting member.

3. The fault current limiter according to claim 1, wherein said projection member is a column-shaped member formed on the surface of said superconducting member and projecting outward from the surface of said superconducting member.

4. The fault current limiter according to claim 1, wherein said superconducting member includes:

a superconducting wire including said superconductor;

a container configured to hold therein said superconducting wire; and a filler filling a space inside said container between said superconducting wire and an inner wall of said container.

5. The fault current limiter according to claim 1, wherein said superconducting member includes:

a superconducting wire including said superconductor; and a covering material covering an outer periphery of said superconducting member.

6. The fault current limiter according to claim 1, wherein said superconducting member is a superconducting wire including said superconductor.

7. A fault current limiter configured to perform a current limiting operation through the use of a superconductor, comprising:

a superconducting wire including said superconductor;

a cooling container configured to house therein a coolant for cooling said superconducting wire; and a suppression member configured to prevent a boiling state of said coolant from transiting from a nucleate boiling state to a film boiling state in the case where said coolant boils on a surface of said superconducting wire due to a temperature rise of said superconductor during the current limiting operation, wherein said suppression member includes a projection member formed on the surface of said superconducting wire.

* * * * *